US005516729A

United States Patent [19]
Dawson et al.

[11] Patent Number: 5,516,729
[45] Date of Patent: May 14, 1996

[54] METHOD FOR PLANARIZING A SEMICONDUCTOR TOPOGRAPHY USING A SPIN-ON GLASS MATERIAL WITH A VARIABLE CHEMICAL-MECHANICAL POLISH RATE

[75] Inventors: Robert Dawson, Austin, Tex.; Kenneth J. Ponder, Las Gatos, Calif.

[73] Assignee: Advanced Micro Devices, Inc., Sunnyvale, Calif.

[21] Appl. No.: 253,807

[22] Filed: Jun. 3, 1994

[51] Int. Cl.$^6$ ............... H01L 21/304; H01L 21/3105; H01L 21/316

[52] U.S. Cl. ............... 437/228; 437/231; 156/636.1

[58] Field of Search ............... 156/636; 437/231, 437/228

[56] References Cited

U.S. PATENT DOCUMENTS

| | | | |
|---|---|---|---|
| 4,446,194 | 5/1984 | Candelaria et al. | 428/428 |
| 4,894,351 | 1/1990 | Batty | 437/190 |
| 4,954,459 | 9/1990 | Avanzino et al. | 437/228 |
| 5,166,101 | 11/1992 | Lee et al. | 437/238 |
| 5,169,491 | 12/1992 | Doan | 156/636 |
| 5,217,566 | 6/1993 | Pasch et al. | 156/636 |
| 5,234,860 | 8/1993 | Gluck | 156/636 |
| 5,246,884 | 9/1993 | Jaso et al. | 437/225 |
| 5,252,515 | 10/1993 | Tsia et al. | 437/195 |
| 5,286,675 | 2/1994 | Chen et al. | 437/195 |
| 5,290,396 | 3/1994 | Schoenborn et al. | 156/636 |
| 5,302,233 | 4/1994 | Kim et al. | 156/636 |
| 5,312,512 | 5/1994 | Allman et al. | 156/636 |
| 5,332,694 | 7/1994 | Suzuki | 437/195 |
| 5,356,513 | 8/1994 | Burke et al. | 156/636 |
| 5,403,780 | 4/1995 | Jain et al. | 437/195 |

OTHER PUBLICATIONS

Wolf, Stanley, 'Si Proc. for the VLSI Era', vol. 2, pp. 198–235 (1990).

Hausamann, C. and P. Mokrisch, 'The Dependance . . . Area Ratio', 1988 Proc. of 5th International IEEE VLSI Multilevel Interconnection Conf., Jun. 13–14, 1988, p. 293.

Lifshitz, et al., "Water–Related Degradation of Contacts in the Multilevel MOS IC with Spin–on Glasses as Interlevel Dielectrics", *I.E.E.E.*, (Dec. 1989), vol. 10, No. 12, pp. 562–564.

Tong, et al., "Process and Film Characterization of PECVD Borophosphosilicate Films for VLSA Applications", *Solid State Technology*, (Jan. 1984), pp. 161–169.

Patrick, et al., "Plasma–Enhanced Chemical Vapor Deposition of Silicon Dioxide Films Using Tetraethoxysilane and Oxygen: Characterization and Properties of Films", *J. Electrochem. Soc.*, (Sep. 1992), vol. 139, No. 9, pp. 2604–2613.

Sivaram, et al., "Planarizing Interlevel Dielectrics by Chemical–Mechanical Polishing", *Solid State Technology*, (May 1992), pp. 87–91.

Jairath, et al., "Slurry Chemistry Effects During Chemical–Mechanical Polishing of S Oxide Films", *Multilevel Interconnection*, (1993), vol. 2090, pp. 103–111.

*Primary Examiner*—R. Bruce Breneman
*Assistant Examiner*—Matthew Whipple
*Attorney, Agent, or Firm*—Kevin L. Daffer

[57] ABSTRACT

A method is provided for forming a planarization structure of dielectrical materials upon a substrate topography. The dielectric materials are deposited as first and second insulating layers. The second, and then the first insulating layers are partially removed by chemical-mechanical polish (CMP). Prior to CMP, the second insulating layer of variable chemical and mechanical properties can be fixed at a preferred chemical or mechanical characteristic which makes it more or less susceptible to subsequent CMP. Accordingly, the present invention utilizes a second insulating layer of adjustable properties necessary to more adequately planarize during application of CMP.

16 Claims, 3 Drawing Sheets

METHOD FOR PLANARIZING A SEMICONDUCTOR TOPOGRAPHY USING A SPIN-ON GLASS MATERIAL WITH A VARIABLE CHEMICAL-MECHANICAL POLISH RATE

BACKGROUND OF THE INVENTION

1. Field of the Invention

This invention relates to integrated circuit manufacture and more particularly to an insulating layer having adjustable chemical and mechanical properties which can be polish removed at a rate set in accordance with the chosen properties.

2. Description of the Relevant Art

The density of active devices placed upon a single monolithic substrate has steadily increased over the years. As the minimum feature size on an integrated circuit decreases, the active device density increases. As a result, the density of overlying interconnect must also be increased. With limited area, interconnect density is often forced to dimensionally expand above the substrate in a multi-level arrangement. Accordingly, multi-level interconnect structures have become a mainstay in modern integrated circuit manufacture.

In addition to added process complexity, multi-level interconnect causes a loss of topological planarity of the integrated circuit upper surface. Loss of planarity can cause many problems which can impact upon manufacturing yield. Exemplary problems include stringers arising from incomplete etching over severe steps, failure to open vias due to interlevel dielectric thickness disparity, poor adhesion to underlying materials, step coverage problems as well as depth-of-focus problems. Many manufacturers have undergone extensive research in methods for planarizing the topological layers in order to avoid the above problems. Generally speaking, manufacturers have focused upon planarizing the dielectric layers ("interlevel dielectric layers") placed between the levels of multi-level interconnect structures.

A well known method in which to planarize interlevel dielectric layers is through use of a sacrificial etch back technique. Sacrificial etch back involves the use of a conformal dielectric placed over the silicon substrate or lower metalization layer. Next, a planarizing layer, generally a low viscosity liquid which can be cured as a dielectric, is placed over the conformal oxide. The planarizing layer generally comprises either a photoresist, polyimide, or spin-on glass ("SOG"). The planarizing layer is often much thicker than the underlying conformal oxide and is removed at an etch rate substantially similar to the etch rate of the underlying oxide. Oftentimes, the sacrificial planarizing layer is removed in a plasma (typically, $O_2$ or $O_2$ mixed with $CF_4$). The etch process is continued until most, if not all, of the sacrificial planarizing layer is removed leaving a more planar upper surface upon which subsequent interconnect structures can be placed. To achieve the desired degree of planarity and final interlevel dielectric thickness, tight process control is necessary for etch-rate uniformity across the wafer and end-point detection of the etch process.

While a liquid-based planarizing layer has many advantages over CVD deposited or sputter deposited layers, liquid-based layers such as SOG layers generally etch at or near the same etch rate as the underlying conformal oxide layer. By design, many manufacturers fix the etch rate of each layer so that they are substantially similar. Monitoring of etch rate and end-point detection is sometimes difficult under etching methodologies. As a result, more recent planarization schemes utilize chemical-mechanical polishing ("CMP"). CMP has a unique advantage in that it can rapidly remove elevated features without significantly thinning the flat areas. Moreover, CMP can reduce the thickness in raised areas more so than in recessed areas due to the fact that raised areas contact with the polishing pad and are abraded to a greater extent than the recessed areas. By applying mechanical as well as chemical abrasion to the uppermost surfaces, CMP achieves greater planarization than conventional etching (i.e., etching without conjunctive mechanical abrasion).

Recent studies have indicated the importance of fixing detection of a CMP end point. Generally speaking, end-point detection can be fixed by depositing a harder (more dense) material upon a softer (less dense) oxide. An exemplary, CMP etch stop configuration is described in U.S. Pat. No. 5,246,884 to Jaso, et al. In Jaso, et al., a hard CVD diamond-like carbon is placed upon a sputter deposited oxide. The diamond-like carbon is removed at elevated portions. As the elevated portions and underlying oxide are removed to a lower elevational level, the lower elevation diamond-like coated material functions as an etch stop. The lower-coated diamond-like carbon thereby functions to planarize its surface with the removed upper (raised) surface. Diamond-like carbon, like many etch stop substances, cannot be left as part of the interlevel dielectric. Conventional CMP etch stop substances are dissimilar from standard oxides or standard interlevel dielectrics and therefore electrically function differently than the remainder of the interlevel dielectric. Generally speaking, many conventional CMP etch stop materials have chemical and mechanical irregularities which can reduce the dielectric properties of the overall structure.

Another problem often associated with conventional CMP etch stop materials is their inability to take on different chemical and mechanical properties. In many instances, it would be desirable to change the mechanical and chemical properties of the polish etch stop material to match the polish slurry being used or the polish pressure being applied. It would be desirable to fix the chemical and mechanical properties prior to the CMP step so that the etch stop is less susceptible (or possibly more susceptible) to CMP than the underlying conformal insulating material. It would be still further advantageous to be able to vary the chemical and mechanical properties of the CMP etch stop material, in relation to underlying conformal insulating material. For reasons stated above, it would therefore be highly desirable to provide a polish etch stop material above a conformal insulating material, wherein the polish etch stop material takes on a variable chemical and mechanical property fixed prior to CMP.

SUMMARY OF THE INVENTION

The problems outlined above are in large part solved by the interlevel dielectric structure of the present invention. That is, the interlevel dielectric structure comprises a first insulating layer placed at a juncture between a substrate (and/or interconnect structure) and an overlying second insulating layer. The second insulating layer is a CMP etch stop material having adjustable chemical and mechanical properties. The properties can be fixed before and after deposition and before CMP to a level which ensures optimal planarization. The polish rate of second insulating layer is at a ratio relative to the first insulating layer. The polish rate ratio is defined such that the overall surface can be planarized using CMP. For example, the CMP etch stop material can be "densified" or "hardened" to make it less susceptible to CMP removal. Making the second insulating layer less susceptible to CMP removal forces the material to having a lesser CMP removal rate than non-hardened or non-densified material. Once the raised portions of the second insulating layer are removed by CMP, the first insulating layer therebelow will be removed at a faster rate to present a higher degree of planarization with the lower, hardened etch-stop material. Depending upon the chemical slurry and polishing pressure used, as well as the underlying composition of the first insulating layer, the second insulating layer (CMP etch stop layer) can take on variable properties. The properties can be specifically chosen for a required degree of planarity, and for the desired application (CMP parameter and first insulating material composition).

It is postulated that spin-on glass (SOG) material chosen for the second insulating material is a prime candidate for having variable chemical and mechanical properties. Furthermore, the SOG material, once hardened is less susceptible than CVD deposited oxide to the slurry polishing compounds used in CMP. Without being bound to theory, it is believed that the slurry particles do not "cut" or microscratch the upper surface of the SOG as easily as CVD oxide. Absent an initial mechanical abrasion, there is less of environment present for high chemical activity. In instances where the SOG remains non-hardened (i.e., not fully cured), SOG is more likely to cut than CVD oxide and is therefore, possibly more prone to CMP.

Broadly speaking, the present invention contemplates a method for planarizing a semiconductor topography. The method includes the steps of providing an upper topography of a semiconductor substrate upon which a first insulating layer is deposited. Next, a second insulating layer of adjustable chemical and mechanical properties is spin deposited upon the first insulating layer. The first insulating layer may be deposited thicker than the second insulating layer and, in some instances, may be twice as thick as the second insulating layer. Alternatively, the first insulating layer may be deposited thinner than the second insulating layer. After first and second insulating layers are placed, the second insulating layer is heated to a temperature level and for a time duration necessary to adjust the chemical and mechanical properties such that the second insulating layer is less (or more) susceptible to CMP than the first insulating layer. Thereafter, CMP is applied to remove the second insulating layer at a lesser (or greater) rate than the first insulting layer in accordance with the chemical and mechanical properties previously established.

Importantly, the second insulating layer comprises a dielectric substance which need not be entirely removed and electrically conforms to the remainder of interlevel dielectric. Preferably, the second insulating layer is a silicate or siloxane placed in a solvent (i.e., SOG composition).

The second insulating layer is heated to proportionally increase or decrease the density, chemical properties and percentage of solvents therein. Change in density and chemical properties affords the second insulating layer a change in its susceptibility to CMP removal. Increase in heat or time exposure to heat will incrementally change the chemical and mechanical properties thereby bringing about an incremental change in removal rate. Removal rate can therefore be fixed in accordance with the underlying material properties (at a higher or lower etch rate with respect to the underlying material). Moreover, the etch rate of the second insulating layer can be fixed relative to the particular chemical slurry and mechanical pressure being applied. Variability in CMP etch stop characteristics is thereby a preferred outcome and object of the present invention.

The present invention further contemplates a method for planarizing a semiconductor topography comprising the steps of inserting into a chamber a semiconductor substrate having an upper surface overlying densely populated areas of less than 2 µm spacing between elements as well as sparsely populated areas of greater than 2 µm spacing between elements. Next, the chamber and semiconductor substrate therein is heated to a level less than 450° C. and, using tetraethoxysilane or silane as the silicon source material, a first insulating layer is chemical vapor deposited upon the semiconductor substrate. The semiconductor substrate is then placed on a rotating wheel and a liquid solution of silicate, siloxane, or silsesquioxane is applied upon the first insulating layer to form a second insulating layer. The first insulating layer may be deposited thicker than the second insulating layer and, in some instances, may be twice as thick as the second insulating layer. Alternatively, the first insulating layer may be deposited thinner than the second insulating layer. A combination of semiconductor substrate, first and second insulating layers are heated to change the chemical and mechanical properties of only the second insulating layer and not the first insulating layer. Heat is chosen between 250° C. and the upper limit defined by underlying metal for a time duration between 10 minutes and 120 minutes. Increase in temperature and duration will proportionally make less susceptible the second insulating layer to a CMP. The second insulating layer is subjected first to CMP followed by subjecting the first insulating layer to CMP. The chemical-mechanical polish comprises an alkali silica slurry and a polishing pad pressure in the 10 to 20 lbs/in$^2$ range. The second insulating layer is removed at a slower rate than the first insulating layer and, after portions of the second insulating layer are removed, first insulating layer underlying those portions are removed at a faster rate to present an upper surface of partially removed first and second insulating layers which is more planar in the densely populated areas than the second insulating layer upper surface prior to CMP. The above steps are repeated to present an upper surface of partially removed first and second insulating layer which are more planar in the sparsely populated areas than the second insulating area upper surface formed prior to chemical-mechanical polish. A third insulating layer of silicon dioxide can then be placed upon the upper surface of partially removed first and second insulating layers to present a tri-layer structure of partially removed first and second layers capped with an overlying third insulating layer.

BRIEF DESCRIPTION OF THE DRAWINGS

Other objects and advantages of the invention will become apparent upon reading the following detailed description and upon reference to the accompanying drawings in which.

Figure 1:
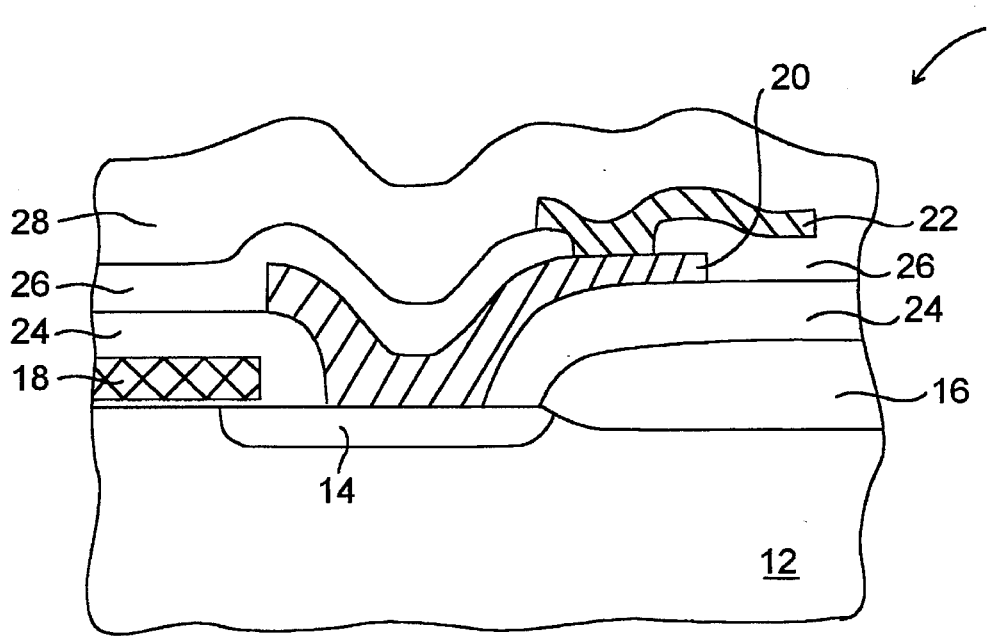
FIG. 1 is a partial cross-sectional view of an integrated circuit with multi-level interconnect structure and interlevel dielectrics according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial cross-sectional view of an integrated circuit 10 is shown. Integrated circuit 10 includes a semiconductor substrate, into which implant regions 14 are placed. Implant 14 occurs according to the self-aligned process between field region 16 and polysilicon gate 18. Electrical contact to implant 14 occurs through a window extending from the first layer of metal 20 and implant 14. A second layer of metal 22 can be connected through a via to first layer 20. Two or more layers of metal (metal layers 20 and 22) comprise multi-level interconnect structure of modern day interconnect technology.

The multi-level interconnect structure not only includes two levels of metal, but also interlevel dielectrics. Interlevel dielectrics includes dielectrics placed between polysilicon 18 (or field oxide 16) and first metal 20 as well as between first and second metal layers 20 and 22. Interlevel dielectrics between polysilicon (or field 16) and first metal 20 are generally referred to as polysilicon/metal dielectric 24. Interlevel dielectrics between metal layers 20 and 22 comprise what is commonly called intermetal dielectrics, and is referenced as numeral 26. Placed over the entire surface of the multi-level interconnect structure is a passivation layer 28. Passivation layer 28 prevents ingress of moisture and contaminants into the underlying topological structure. Defined herein below, "interlevel dielectric" includes polysilicon/metal dielectric 24 and/or intermetal dielectric 26. Accordingly, the interlevel dielectric structure set forth below can be configured between polysilicon and first metal, or between first and second metal. Thus, the process steps necessary to form the present interlevel dielectric can occur after aluminum metalization or before aluminum metalization. The process steps are at low enough temperature to prevent deleterious metal reflow if metal pre-exists on the wafer topography.

Figure 2:
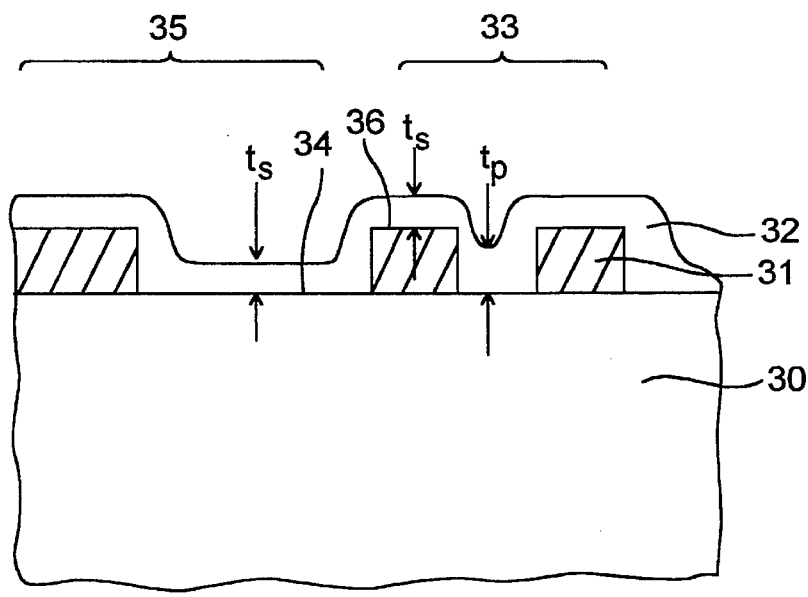
FIG. 2 is a partial cross-sectional view of a first insulating layer placed upon one level of a multi-level interconnect structure according to one step of the present invention.

Referring now to FIG. 2, a partial cross-sectional view of a semiconductor topography 30 is shown. As described above, semiconductor topography can be at an elevational level consistent with the upper surface of the semiconductor substrate or at the first metal layer. Placed on the upper surface of topography 30 and conductors 31 (either polysilicon or aluminum) is a first insulating layer 32. Conductors 31 can have a height and spacing therebetween such that aspect ratio between conductors (height/spacing) exceeds 0.8. Given a 0.8 aspect ratio, first insulating layer 32 is chemical vapor deposition (CVD) deposited from preferably a plasma enhanced tetraethoxysilane (TEOS) source. The plasma enhanced TEOS-based material is deposited at temperatures less than 450° C. to present a silicon dioxide film material which is conformal to the aspect ratio required.

First planarization layer 32 does not provide adequate planarization. As shown, thickness, $t_s$, between less densely patterned (greater than 2 μm spacing) conductors 31 is only slightly less than the thickness, $t_p$, in densely patterned area 33 between conductors 31 spaced less than 2 μm apart. First insulating layer 32 thereby achieves a "smoothing" of the step slopes from surface 34 to surface 36. The step heights, however, are not significantly reduced in magnitude as shown by a comparison of $t_s$ in the densely patterned area versus $t_s$ in the sparsely patterned area 35. In order to achieve at least partial planarization if not complete local planarization, another insulating layer, second insulating layer 38, must be placed over first insulating layer 32, as shown in FIG. 3.

Converse to CVD-deposited first insulating layer 32, second insulating layer 38 is spin-on deposited from a liquid-based material. Preferably, second insulating layer 38 is deposited as silicate or siloxane-based particles suspended within a solvent. The liquid material is spun onto the upper surface of first insulating layer 32 according to known spin techniques. Once placed, the liquid material exhibits greater planarization capabilities than CVD-deposited materials. The spin-on material is preferably a SOG which fills valleys or crevices between densely spaced conductors 31. In sparse area 35, second insulating material 38 provides an enhanced smoothing effect and does present some planarization in the crevices, however, not enough to fully planarize that area.

Figure 3:
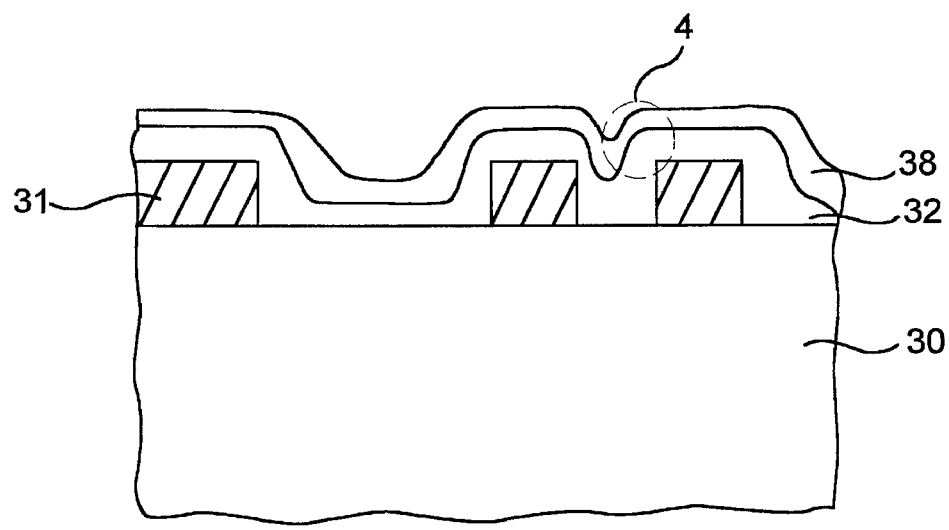
FIG. 3 is a partial cross-sectional view of a second insulating layer placed upon the first insulating layer according to another step of the present invention.
Figure 4:
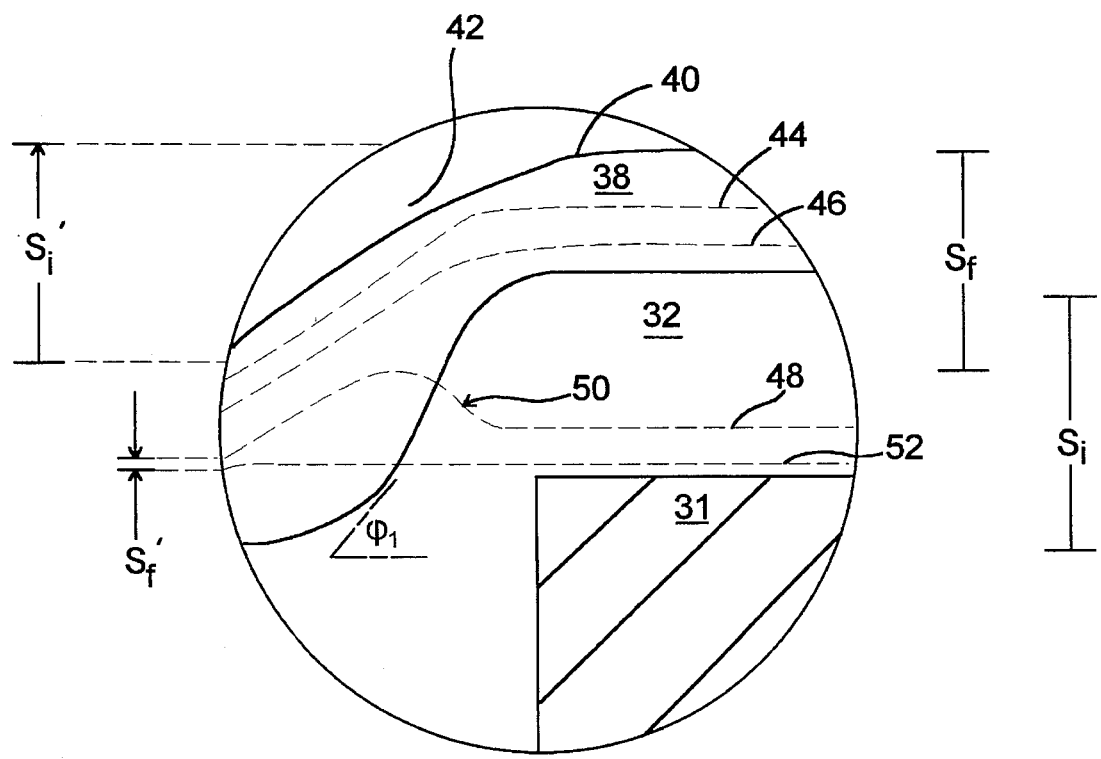
FIG. 4 is a detailed view of area 4 of FIG. 3 illustrating time-area removal planes according to the present invention.

Referring now to FIG. 4, a detailed view of area 4 in FIG. 3 is shown. Specifically, FIG. 4 illustrates the smoothing effect of the first insulating layer 32 placed over conductor 31. Smoothing, caused by the first insulating layer, lessens the step slope from a 90° angle to an angle less than 90°. The smoothing angle or "flow angle" is shown as $\Phi_1$. The smoothing effect and lessened flow angle aids subsequent planarization achieved by second insulating layer 38. As shown, second insulating layer has an even less flow angle than $\Phi_1$ and provides at least partial planarization over densely patterned area 33. Application of second insulating layer 38 reduces the step height from that of the first insulating layer from step height $S_i$ to $S_f$. Using the materials and deposition procedures set out above, first insulating layer 32 is highly conformal, while second insulating layer 38 can fill areas of aspect ratio greater than 0.8. Accordingly, SOG overlying silicon dioxide provides a suitable local planarization methodology for modern day, densely patterned topological structures.

After first and second insulating areas are deposited, the layers can be at least partially removed in succession. Prior to removal, second insulating layer 38 is adapted for receiving a thermal cycle defined at a level and duration necessary to densify and change the chemical composition of that layer. Incremental increase in heat causes an incremental mechanical hardening and chemical change in the composition of second insulating layer 38. Sufficient hardening will allow the variable chemical and mechanical properties to be fixed greater than (or possibly less than) the underlying first insulating layer. In the exemplary embodiment shown in FIG. 4, second insulating layer 38 is hardened beyond that of first insulating layer 32. During CMP, the upper surface 40 is removed at a faster rate than the sides or lower surface 42 to present a first removal profile 44 at time $t_1$. At a subsequent time $t_2$ equal in duration to time $t_1$, a second removal profile 46 is shown. At a further subsequent time $t_3$, a third removal profile 48 occurs. Third removal profile 48 is illustrative of the faster removal rate within first insulating layer 32 than that of second insulating layer 38. Arising from the disparity between removal rates, a cusp 50 may arise at the interface. Cusp 50, as an elevated feature, is rapidly removed with subsequent etch polishing, as shown at fourth removal profile 52. Fourth removal profile is slightly elevated from the upper surface of conductor 31 and is substantially planar at least in local areas, if not globally planar.

Figure 5:
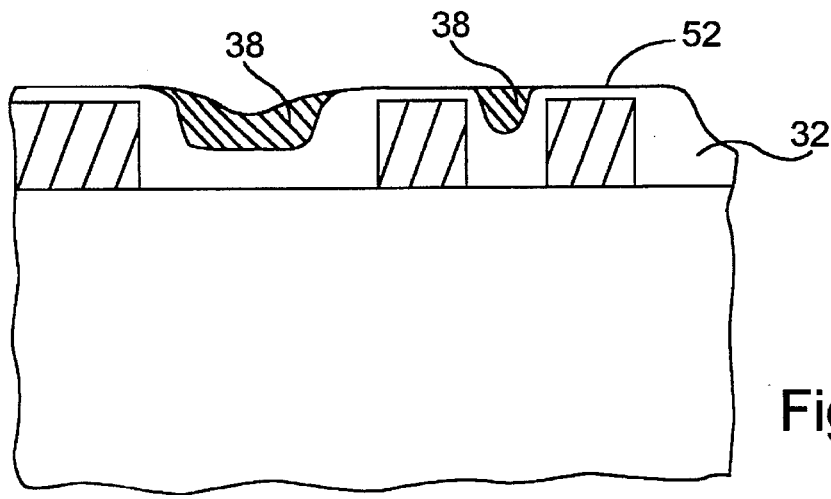
FIG. 5 is a partial cross-sectional view of the multi-level interconnect structure after CMP according to the present invention.
Figure 6:
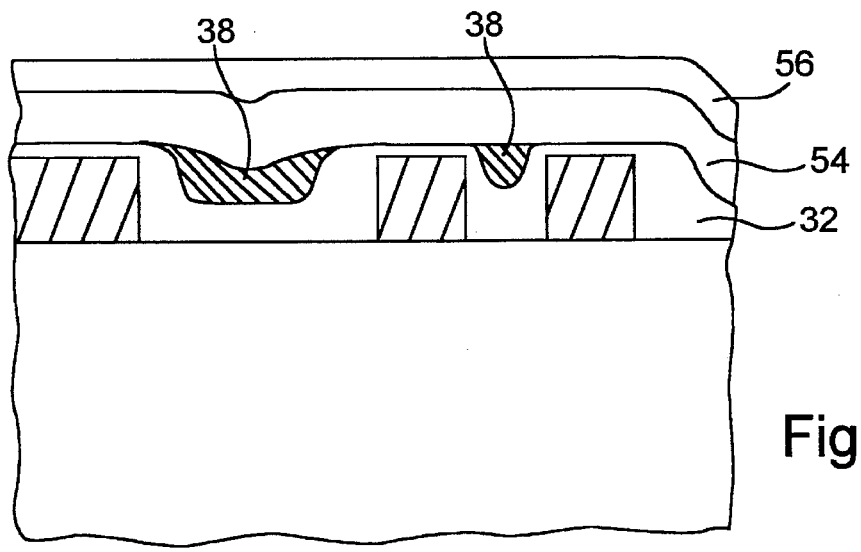
FIG. 6 is a partial cross-sectional view of the multi-level interconnect structure after CMP and subsequent to deposition of an additional pair of insulating layers according to another embodiment of the present invention.
Figure 7:
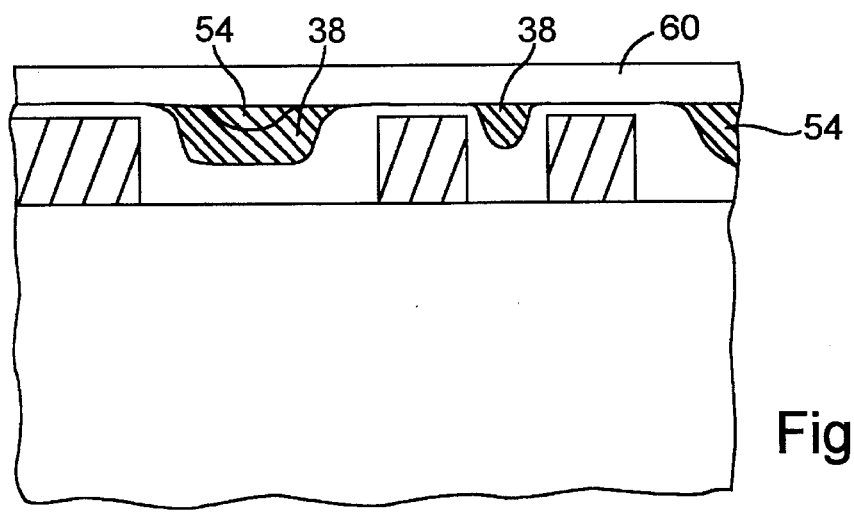
FIG. 7 is a partial cross-sectional view of the multi-level interconnect structure after removal of at least a portion of the additional pair of insulating layers followed by deposition of a capping third insulating layer according to the present invention.

FIG. 5 illustrates the multi-level interconnect structure after CMP, wherein the upper surface is consistent with the fourth removal profile 52, shown in FIG. 4. Accordingly, the upper surface is substantially planar in densely patterned area 33. Other areas which are not densely patterned can be planarized by repeating the deposition of first and second insulating layers followed by subsequent CMP etch back. The upper surface, or fourth removal profile 52, shown in FIG. 5 indicates partial removal of first insulating layer 32 and partial removal of upper elevated regions of second insulating layer 38. Lower elevated regions of second insulating layer 38 remain, and are shown in cross-hatch. Complete planarization not just in local areas of densely patterned regions but also across the entire global upper surface can be achieved by repeating the process steps of FIGS. 2 and 3 upon the upper surface profile 52. Re-application of first and second insulating layers are shown in FIG. 6, and are placed upon previously placed, partially removed underlying insulating layers. In particular, placed upon upper surface 52 of partially removed first and second insulating layer 32 and 38 is a fourth insulating layer 54 and a fifth insulating layer 56. Fourth insulating layer 54 can be taken from a TEOS source and deposited in a plasma enhanced CVD chamber, similar to first insulating layer 32. Likewise, fifth insulating layer 56 is spin-deposited from a liquid based material such as SOG, similar to second insulating layer 38. The fifth and fourth insulating layers 56 and 54, respectively, are then at least partially CMP removed, as shown in FIG. 7. A capping layer, or third insulating layer 60, is advantageously placed over the partially removed first insulating layer 32, second insulating layer 38, fourth insulating layer 54 and, if necessary, fifth insulating layer 56. Third insulating layer 60 provides mechanical and electrical separation and essentially encapsulates for electrical reasons the partially removed layers between first and third insulating layers. Third insulating layer 60 is preferable thicker than second insulating layer 38. Third insulating layer 60 can, if desired, be placed over upper surface 52, as shown in FIG. 5. Thus, instead of repeating the process steps for complete global planarization, third planarizing layer 60 can be placed over partially removed second insulating layer 38 for local planarization only.

It will be appreciated to those skilled in the art having the benefit of this disclosure that this invention is believed to be capable of applications with multiple levels of interconnect and can be repeated to form interlevel dielectrics between each level of interconnect. Furthermore, it is also to be understood that the form of the invention shown and described is to be taken as exemplary, presently preferred embodiments. The first and second insulating layers are at least partially removed prior to deposition of a capping layer. If the overlying SOG layer and underlying oxide layer are removed, CMP and not etching is used as the removal process. Various modifications and changes may be made without departing from the spirit and scope of the invention as set forth in the claims. It is intended that the following claims be interpreted to embrace all such variations and modifications.

What is claimed is:

1. A method for planarizing a semiconductor topography, comprising the steps of:

providing an upper topography of a semiconductor substrate;

depositing a first insulating layer upon said upper topography;

spin depositing a second insulating layer of adjustable chemical and mechanical properties upon said first insulating layer;

heating said second insulating layer to a temperature level and for a time duration necessary to adjust the chemical and mechanical properties such that the second insulating layer is less susceptible to a chemical-mechanical polish than said first insulating layer; and applying a chemical-mechanical polish for removing said second insulating layer at a lesser rate than said first insulating layer in accordance with the chemical and mechanical properties set in the immediately preceding step, wherein said second insulating layer is removed at a lesser rate than said first insulating layer throughout said applying step.

2. The method as recited in claim 1, further including the step of, without removing the entire said second insulating layer, thereafter depositing a third insulating layer upon the remainder of said first and second insulating layers.

3. The method as recited in claim 1, wherein said spin depositing step comprises placing a silicate in a solvent and spin depositing said silicate and solvent upon said first insulating layer.

4. The method as recited in claim 1, wherein said spin depositing step comprises placing a siloxane in a solvent and spin depositing said siloxane and solvent upon said first insulating layer.

5. The method as recited in claim 1, wherein said heating step comprises:

placing said substrate and said first and second insulating layers into a chamber; and heating said chamber to a temperature exceeding 250° C., wherein incremental heating above 250° C. causes a corresponding incremental increase in density and decrease in the percentage of solvent within said second insulating layer.

6. The method as recited in claim 1, wherein said heating step comprises selecting a heat amount and time duration sufficient to fix the chemical and mechanical properties of the second insulating layer to a less removable state relative to the first insulating layer when the first and second layers are therafter subjected to a alkali silica slurry and a polishing pad pressure in the 10 to 20 lbs/in$^2$ range.

7. The method as recited in claim 1, wherein said first insulating layer is CVD deposited from a silane source at a temperature level less than 450° C.

8. The method as recited in claim 1, wherein said second insulating layer is a spin-on glass comprising silicate.

9. The method as recited in claim 1, wherein said first insulating layer is deposited thicker than said second insulating layer.

10. The method as recited in claim 1, wherein said first insulating layer is deposited more than twice as thick as said second insulated layer.

11. The method as recited in claim 1, wherein said first insulating layer is deposited thinner than said second insulating layer.

12. A method for planarizing a semiconductor topography, comprising the steps of:

inserting into a chamber a semiconductor substrate having an upper surface overlying densely populated areas of less than 2 mm. spacing between elements and sparsely populated areas of greater than 2 mm. spacing between elements;

heating said chamber to a level less than 450° C. and, using tetraethoxysilane as the silicon source material, chemical vapor depositing a first insulating layer of silicon dioxide upon said semiconductor substrate;

placing said semiconductor substrate upon a rotating wheel and applying a liquid solution of silicate upon said first insulating layer to form a second insulating layer;

heating the combination of said semiconductor substrate and said first and second insulating layers to change the chemical and mechanical characteristics of only said second insulating layer, wherein said heat is chosen between 250° C. and 450° C. and for a time duration between 10 min. and 120 min., and wherein increase in temperature and duration will proportionally make less susceptible said second insulating layers to a chemical-mechanical polish;

subjecting said second insulating layer first and said first insulating layer second to a chemical-mechanical polish comprising an alkali silica slurry and a polishing pad pressure in the 10 to 20 lbs/in$^2$ range, wherein said second insulating layer is removed at a slower rate than said first insulating layer and, after portions of said second insulating layer are removed, first insulating layer underlying said portions are removed at a faster rate than remaining portions of said second insulating layer are removed to present an upper surface of partially removed said first and second insulating layers which is more planar in the densely populated areas than the second insulating layer upper surface formed during the placing step;

repeating the above steps to present an upper surface comprising partially removed said first and second insulating layers which is more planar in the sparsely populated areas than the second insulating layer upper surface formed during the placing step; and depositing a third insulating layer of silicon dioxide upon the upper surface of partially removed said first and second insulating layers.

13. The method as recited in claim 12, wherein said first insulating layer is deposited thicker than said second insulating layer.

14. The method as recited in claim 12, wherein said first insulating layer is deposited more than twice as thick as said second insulated layer.

15. The method as recited in claim 12, wherein said third insulating layer is thicker than said second insulating layer.

16. The method as recited in claim 12, wherein said first insulating layer is deposited thinner than said second insulating layer.

\* \* \* \* \*